United States Patent

Huang (10) Patent No.: US 9,093,993 B2
(45) Date of Patent: Jul. 28, 2015

(54) POWER SAVING CIRCUIT FOR PWM CIRCUIT

(75) Inventor: Wei-Hsuan Huang, Taoyuan (TW)

(73) Assignee: SYSTEM GENERAL CORP., Shin-Dian (TW)

( * ) Notice: Subject to any disclaimer, the term of this patent is extended or adjusted under 35 U.S.C. 154(b) by 1076 days.

(21) Appl. No.: 12/183,111

(22) Filed: Jul. 31, 2008

(65) Prior Publication Data

US 2010/0026381 A1 Feb. 4, 2010

(51) Int. Cl.
G05F 1/46 (2006.01)
H03K 3/0231 (2006.01)
H02M 3/335 (2006.01)
H03K 3/012 (2006.01)
H03K 7/08 (2006.01)
H02M 1/00 (2007.01)

(52) U.S. Cl.
CPC ......... *H03K 3/0231* (2013.01); *H02M 3/33507* (2013.01); *H03K 3/012* (2013.01); *H03K 7/08* (2013.01); *H02M 2001/0032* (2013.01); *Y02B 70/16* (2013.01)

(58) Field of Classification Search
USPC .............. 323/265, 282–284; 363/21.05, 21.1, 363/21.12, 21.13, 95, 97; 327/176, 544
See application file for complete search history.

(56) References Cited

U.S. PATENT DOCUMENTS

| 5,663,667 | A | * | 9/1997 | Blum et al. | 327/134 |
| 7,215,107 | B2 | * | 5/2007 | Djenguerian et al. | 323/284 |
| 7,378,889 | B2 | * | 5/2008 | Wu | 327/176 |
| 7,710,095 | B2 | * | 5/2010 | Huang et al. | 323/288 |
| 2002/0105767 | A1 | * | 8/2002 | Schuellein et al. | 361/93.1 |
| 2006/0132998 | A1 | | 6/2006 | Agari | |
| 2006/0164055 | A1 | * | 7/2006 | Hata et al. | 323/282 |
| 2007/0176583 | A1 | * | 8/2007 | Hachiya et al. | 323/282 |
| 2008/0309312 | A1 | * | 12/2008 | Lin et al. | 323/318 |

FOREIGN PATENT DOCUMENTS

| CN | 1787350 A | 6/2006 |
| CN | 1885661 A | 12/2006 |
| TW | 200633361 | 9/2006 |
| TW | 200705790 | 2/2007 |

\* cited by examiner

*Primary Examiner* — Emily P Pham
(74) *Attorney, Agent, or Firm* — Ming Chow; Sinorica, LLC (57) ABSTRACT

The present invention provides a power saving circuit for PWM circuit. The power saving circuit is utilized to control at least one internal circuit. The power saving circuit comprises a switching circuit which generates a switching signal. The power saving circuit controls the internal circuit in response to the switching. The power saving circuit disables the internal circuit for power saving when the switching signal is disabled.

19 Claims, 10 Drawing Sheets

POWER SAVING CIRCUIT FOR PWM CIRCUIT

BACKGROUND OF THE INVENTION

1. Field of the Invention

The present invention relates to a power saving circuit, and more particularly, to a power saving circuit for a PWM circuit.

2. Description of Related Art

With the progress of modern science, the functionality of the electronic devices becomes better and better for people it is more the convenience in the living. Nowadays, greater part of the electronic devices includes a Pulse Width Modulation (PWM) circuit to generate a PWM signal. The PWM signal serves a switching signal for controlling other circuits of the electronic device, such as power supply, power converter, regulator, and driving circuit, etc. The switching signal of the PWM circuit is disabled to control the controlled circuits of the electronic device. At this moment in time, the actions of a part of the internal circuits of the PWM circuit or a part of the internal circuits of the electronic device are not effective, such as protection circuit of the PWM circuit. The protection circuit is utilized to control the PWM circuit in response to the state of the controlled circuits of the electronic device. The action of the protection circuit is not effective due to the controlled circuits of the electronic device is disabled by the switching signal. However, these no effect internal circuits are still operating and consuming power that wastes the power.

SUMMARY OF THE INVENTION

The present invention provides a power saving circuit for PWM circuit. The power saving circuit comprises a switching circuit to generate a switching signal for switching a circuit. The switching signal is further utilized to control at least one internal circuit. The internal circuit is disabled for power saving when the switching signal is disabled. The power saving circuit further comprises a dead-time control circuit to generate a dead-time control signal in response to the switching signal. The dead-time control signal controls the internal circuit. The dead-time control signal disables the internal circuit when the switching signal is disabled. The power saving circuit of the prevent invention can disable the internal circuit when the switching signal is disabled. Therefore, the power saving circuit can reduce the power consumption for power saving when the switching signal is disabled.

DESCRIPTION OF THE PREFERRED EMBODIMENTS

Figure 1:
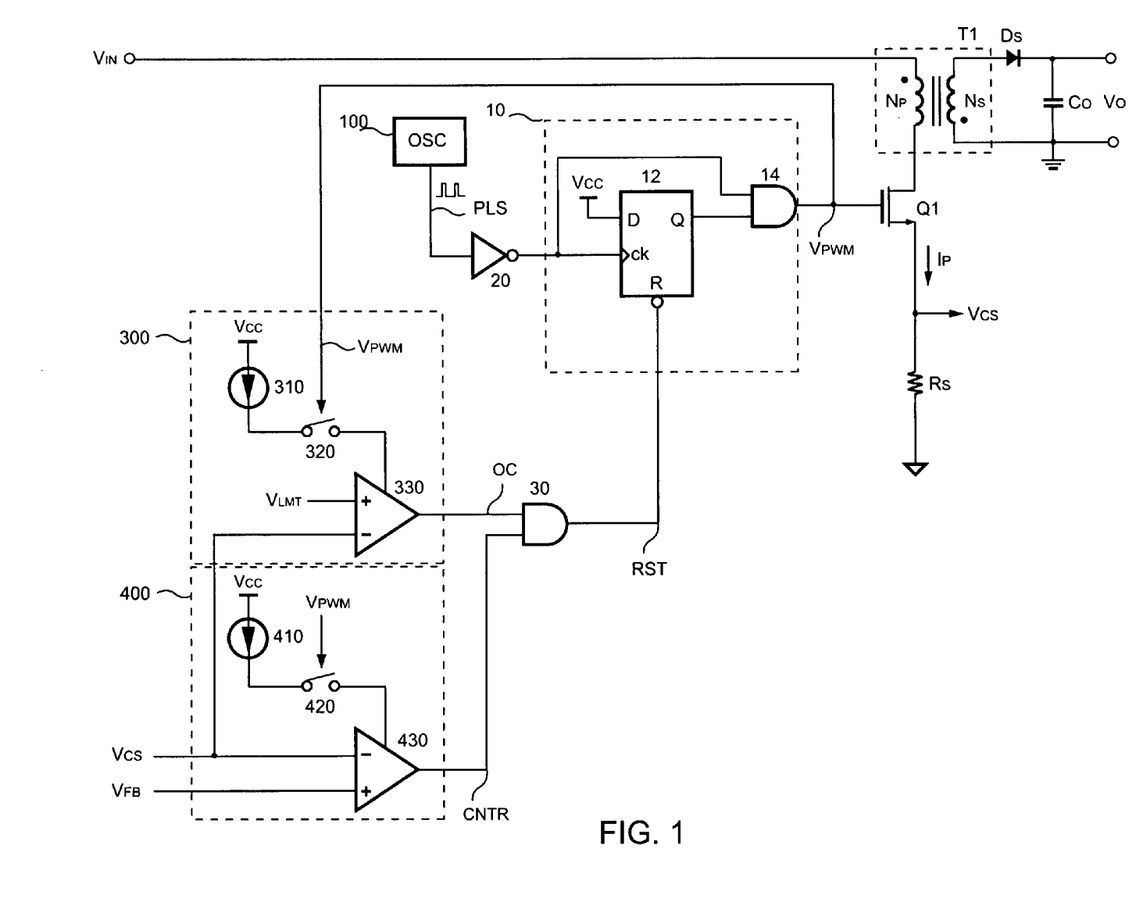
FIG. 1 shows a circuit diagram of one embodiment of a power supply with a PWM circuit and a power saving circuit in accordance with the present invention.

Referring to FIG. 1, a power supply with a PWM circuit and a power saving circuit is illustrated according to one embodiment of the present invention. The PWM circuit is not only applied to the power supply, the PWM circuit can be applied to various circuits, and the power saving circuit of the present invention can be applied to PWM circuit of the various circuits. The PWM circuit of the power supply is used as on of the embodiment in the present invention but should not be limited to that the power saving circuit of the present invention is only applied to the PWM circuit of the power supply. As shown in FIG. 1, the power supply comprises a transformer T1 having a primary winding $N_P$ and a secondary winding $N_S$. Two sides of the primary winding $N_P$ are coupled to an input voltage $V_{IN}$ and a switch Q1 respectively. The switch Q1 is utilized to switch the transformer T1. The switch Q1 can be a power transistor. A resistor $R_S$ is connected serially with the switch Q1 and the ground to generate a current signal $V_{CS}$ in response to a switching current $I_P$ of the transformer T1. The secondary winding $N_S$ is coupled to an output terminal of the power supply and outputs an output voltage $V_O$. A side of the secondary winding $N_S$ is coupled to a rectifier $D_S$. A capacitor $C_O$ is coupled to the rectifier $D_S$ and another side of the secondary winding $N_S$.

A switching circuit 10 is coupled to generate a switching signal $V_{PWM}$ to control the switch Q1 for switch the transformer T1. The switching circuit 10 includes a flip-flop 12 and a AND gate 14. The input terminal D of the flip-flop 12 is coupled a supply voltage $V_{CC}$. The clock input terminal CK of the flip-flop 12 is coupled to receive a plus signal PLS through an inverter 20. The output terminal Q of the flip-flop 12 is coupled to the input terminal of the AND gate 14. Another input terminal of the AND gate 14 is coupled to receive the plus signal PLS through the inverter 20. The output terminal of the AND gate 14 generates the switching signal $V_{PWM}$ to control the switch Q1. The reset terminal R of the flip-flop 12 is coupled to receive a reset signal RST to reset the flip-flop 12 to disable the switching signal $V_{PWM}$. An oscillator (OSC) 100 generates the plus signal PLS. The plus signal PLS is coupled to the clock input terminal Ck of the flip-flop 12 and the input terminal of the AND gate 14 through the inverter 20.

A first internal circuit 300 of the PWM circuit includes a first current source 310, a first switch 320 and a first comparator 330. The first current source 310 is coupled to the supply voltage $V_{CC}$ for supplying power to the first comparator 330 through the first switch 320. The first switch 320 is coupled between the first current source 310 and the first comparator 330. The first switch 320 is controlled by the switching signal $V_{PWM}$. The positive terminal of the first comparator 330 is coupled to a limit signal $V_{LMT}$. The negative terminal of the first comparator 330 is coupled to receive the current signal $V_{CS}$. The output terminal of the first comparator 330 generates an over current signal OC when the current signal $V_{CS}$ is higher than the limit signal $V_{LMT}$.

A second internal circuit 400 of the PWM circuit includes a second current source 410, a second switch 420 and a second comparator 430. The second current source 410 is coupled to the supply voltage $V_{CC}$ for supplying power to the second comparator 430 through the second switch 420. The second switch 420 is coupled between the second current source 410 and the second comparator 430. The second switch 420 is controlled by the switching signal $V_{PWM}$. The positive terminal of the second comparator 430 is coupled to receive a feedback signal $V_{FB}$. The negative terminal of the second comparator 430 is coupled to receive the current signal $V_{CS}$. The output terminal of the second comparator 430 generates a feedback control signal CNTR when the current signal $V_{CS}$ is higher than the feedback signal $V_{FB}$. In general, the feedback signal $V_{FB}$ is obtained by detecting the output voltage $V_O$ of the power supply through an optical-coupler or a feedback circuit coupled an auxiliary winding of transformer T1 (Figure not shown). The voltage of the auxiliary winding is related to the output voltage $V_O$ of the power supply. Therefore the feedback signal $V_{FB}$ is generated in response to the output voltage $V_O$.

The over current signal OC of the first internal circuit 300 and the feedback control signal CNTR of the second internal circuit 400 are coupled to the input terminals of a AND gate 30. The output terminal of the AND gate 30 generates the reset signal RST to reset the switching circuit 10 for disabling the switching signal $V_{PWM}$. The first internal circuit 300 and the second internal circuit 400 serve as the protection circuit to protect the power supply. The first internal circuit 300 and the second internal circuit 400 are controlled by the switching signal $V_{PWM}$. Therefore, the first internal circuit 300 and the second internal circuit 400 are disabled for power saving when the switching signal $V_{PWM}$ is disabled. The switching signal $V_{PWM}$ is not only control the first internal circuit 300 and the second internal circuit 400 that can control any internal circuits of the PWM circuit or the any internal circuits of the power supply for power saving.

Figure 2:
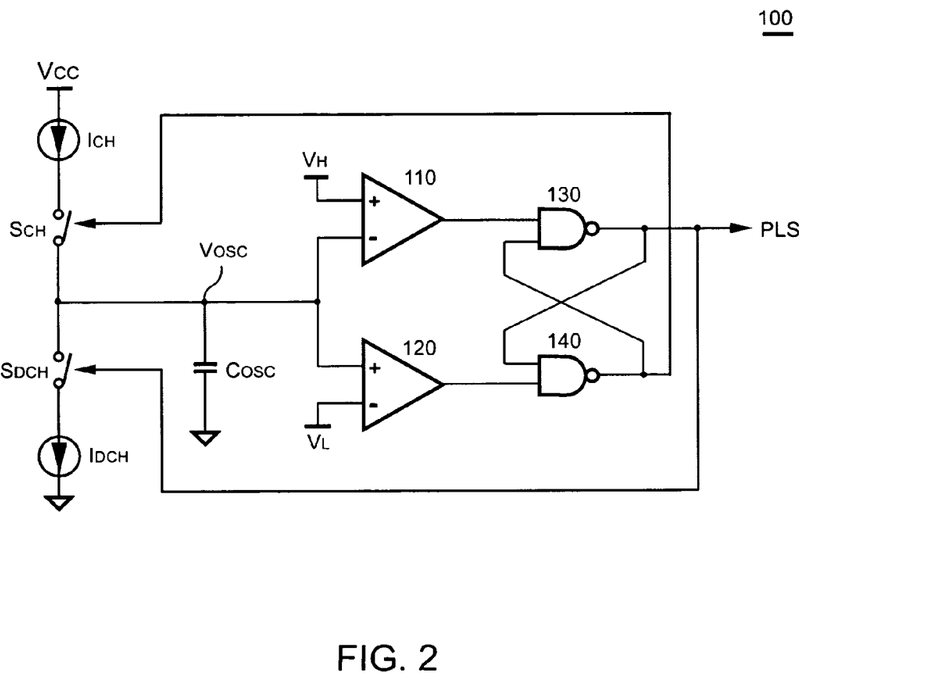
FIG. 2 shows a circuit diagram of one embodiment of an oscillator in accordance with the present invention.

Referring to FIG. 2, the oscillator is illustrated according to one embodiment of the present invention. The oscillator 100 comprises a charge current source $I_{CH}$, a charge switch $S_{CH}$, a discharge current source $I_{DCH}$, a discharge switch $S_{DCH}$, and a capacitor $C_{OSC}$. The charge current source $I_{CH}$ is coupled to the supply voltage $V_{CC}$. The charge switch $S_{CH}$ is coupled between the charge current source $I_{CH}$ and the capacitor $C_{OSC}$. The capacitor $C_{OSC}$ is charged by the charge current source $I_{CH}$ through the charge switch $S_{CH}$. The charge switch $S_{CH}$ is utilized to control the charge of the capacitor $C_{OSC}$. The discharge current source $I_{DCH}$ is coupled to the ground. The discharge switch $S_{DCH}$ is coupled between the discharge current source $I_{DCH}$ and the capacitor $C_{OSC}$. The capacitor $C_{OSC}$ is discharged by the discharge current source $I_{DCH}$ through the discharge switch $S_{DCH}$. The discharge switch $S_{DCH}$ is utilized to control the discharge of the capacitor $C_{OSC}$. An oscillation signal $V_{OCS}$ is therefore produced on the capacitor $C_{OSC}$.

The oscillator 100 further comprises comparators 110, 120, NAND gates 130, 140 for generating the plus signal PLS. The plus signal PLS is further utilized to control the discharge switch $S_{DCH}$. The input terminals of the comparator 110 are coupled to receive a high threshold voltage $V_H$ and the oscillation signal $V_{OSC}$ to compare the oscillation signal $V_{OSC}$ with the high threshold voltage $V_H$. The input terminals of the comparator 120 are coupled to receive a low threshold voltage $V_L$ and the oscillation signal $V_{OSC}$ to compare the oscillation signal $V_{OSC}$ with the low threshold voltage $V_L$. One input terminal of the NAND gate 130 is coupled to the output terminal of the comparator 110. One input terminal of the NAND gate 140 is coupled to the output terminal of the comparator 120. Another input terminal of the NAND gate 140 is coupled to the output terminal of the NAND gate 130. The output terminal of the NAND gate 140 is coupled to another input terminal of the NAND gate 130. The output terminal of the NAND gate 130 generates the plus signal PLS. The output signal of the NAND gate 140 is further utilized to control the charge switch $S_{CH}$.

Figure 3:
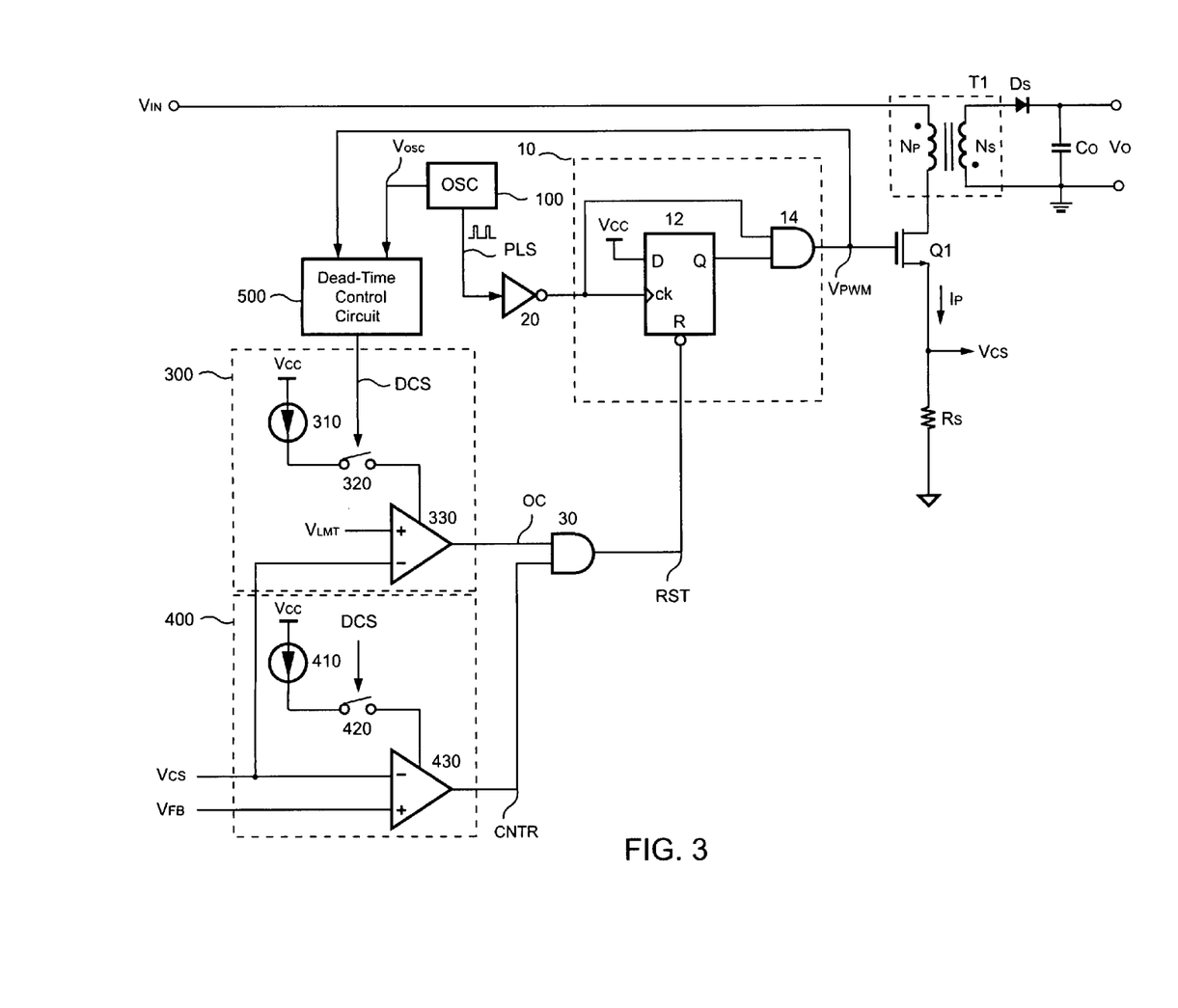
FIG. 3 shows a circuit diagram of second embodiment of the power supply with the PWM circuit and the power saving circuit in accordance with the present invention.

Referring to FIG. 3, the second embodiment of the power supply with the PWM circuit and the power saving circuit is illustrated according to the present invention. AS shown in FIG. 3, most of the circuits of this embodiment are the same as the first embodiment and no more description here, this embodiment further comprises a dead-time control circuit 500 to generate a dead-time control signal DCS in response to the switching signal $V_{PWM}$. The dead-time control circuit 500 is further coupled to the oscillator 100 to receive the oscillation signal $V_{OSC}$ for controlling the dead-time control signal DCS. The dead-time control signal DCS is utilized to controls the first internal circuit 300 and the second internal circuit 400 of the PWM circuit. The dead-time control signal DCS is disabled when the switching signal $V_{PWM}$ is disabled. Therefore, the dead-time control signal DCS disables the first internal circuit 300 and the second internal circuit 400 for power saving when the switching signal $V_{PWM}$ is disabled. The dead-time control signal DCS is not only control the first internal circuit 300 and the second internal circuit 400 that can control any internal circuits of the PWM circuit or any internal circuits of the power supply for power saving.

Figure 4:
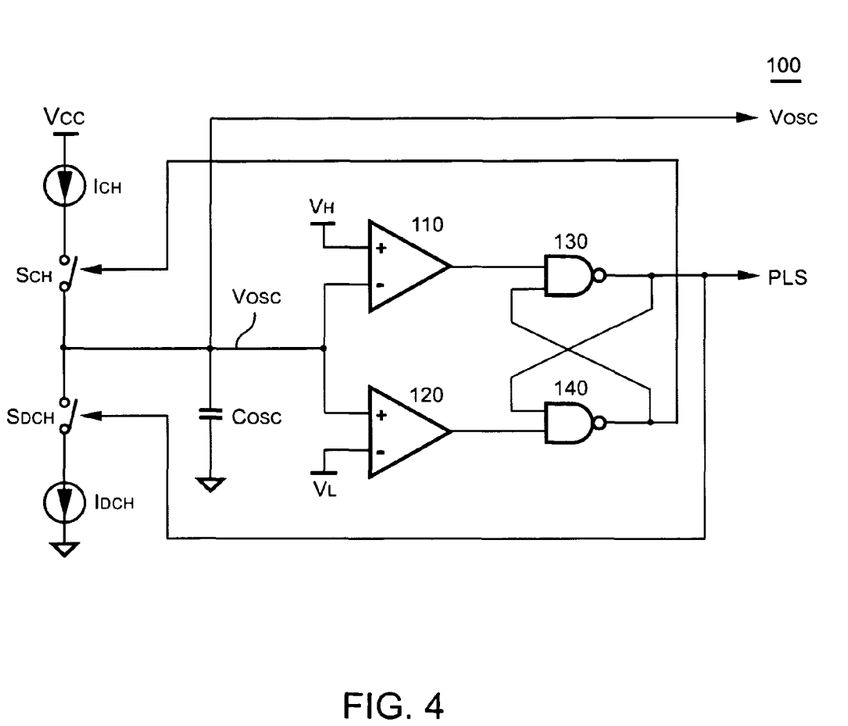
FIG. 4 shows a circuit diagram of second embodiment of the oscillator in accordance with the present invention.

Referring to FIG. 4, the second embodiment of the oscillator is illustrated according to the present invention. AS shown in FIG. 4, most of the circuits of the oscillator 100 of this embodiment are the same as the oscillator 100 of the embodiment in FIG. 2 and no more description here, the main difference between this embodiment and the first embodiment is that the oscillation signal $V_{OSC}$ is further coupled to the dead-time control circuit 500 (shown in FIG. 3) for controlling the dead-time control signal DCS.

Figure 5:
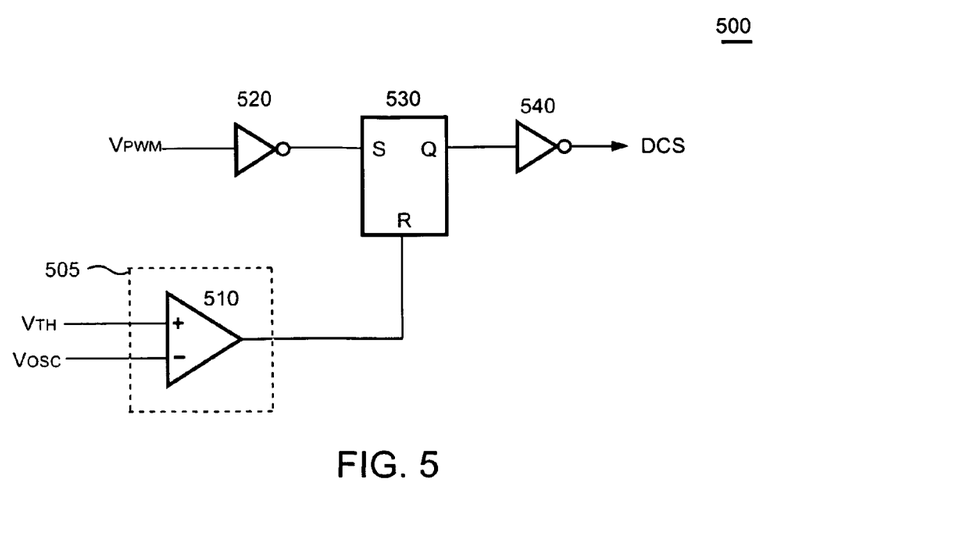
FIG. 5 shows a circuit diagram of one embodiment of a dead-time control circuit in accordance with the present invention.

Referring to FIG. 5, one embodiment of the dead-time control circuit is illustrated according to the present invention. AS shown in FIG. 5, the dead-time control circuit 500 comprises a pre-enabling circuit 505, inverters 520, 540 and a flip-flop 530. The set input terminal S of the flip-flop 530 is coupled to receive the switching signal $V_{PWM}$ through the inverter 520. The reset input terminal R of the flip-flop 530 is coupled to the pre-enabling circuit 505. The pre-enabling circuit 505 includes a comparator 510. The output terminal of the comparator 510 is coupled to the reset input terminal R of the flip-flop 530. The input terminals of the comparator 510 receive a threshold signal $V_{TH}$ and the oscillation signal $V_{OSC}$ and compares the oscillation signal $V_{OSC}$ with the threshold signal $V_{TH}$ to reset the flip-flop 530. The output terminal Q of the flip-flop 530 is coupled to the inverter 540 to generate the dead-time control signal DCS. The dead-time control signal DCS is enabled to enable the first internal circuit 300 and the second internal circuit 400 of the PWM circuit (shown in FIG. 3) when the oscillation signal $V_{OSC}$ is lower than the threshold signal $V_{TH}$. The dead-time control signal DCS is disabled to disable the first internal circuit 300 and the second internal circuit 400 of the PWM circuit (shown in FIG. 3) for power saving when the switching signal $V_{PWM}$ is disabled.

Figure 6:
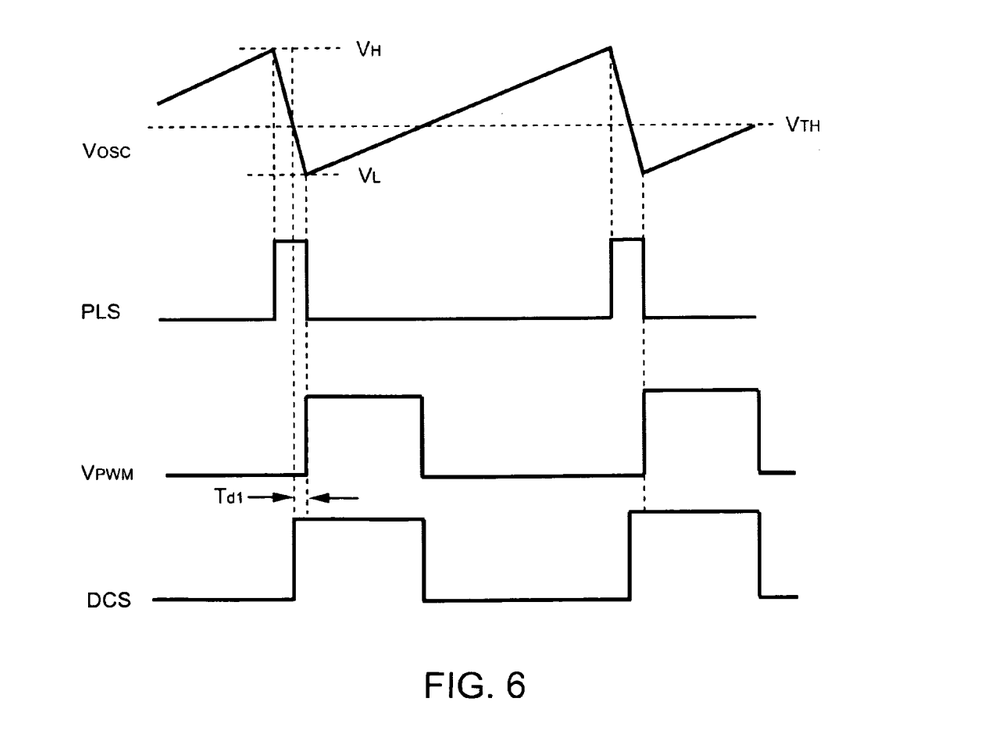
FIG. 6 shows waveforms of the power saving circuit of the present invention.

Referring to FIG. 6, it shows waveforms of the power saving circuit of the present invention. AS shown in FIG. 6, the threshold signal $V_{TH}$ is lower than the high threshold voltage $V_H$ and higher than the low threshold voltage $V_L$. The pre-enabling circuit 505 (shown in FIG. 5) is used to pre-enable the dead-time control signal DCS before the switching signal $V_{PWM}$ is enabled. Therefore, the enabled-time of the dead-time control signal DCS is earlier than the enabled-time of the switching signal $V_{PWM}$. The enabled-time of the dead-time control signal DCS is advanced by a time $T_{d1}$ that the enabled-time of the dead-time control signal DCS is compared with the enabled-time of the switching signal $V_{PWM}$. The enabled-time of the dead-time control signal DCS is determined by the oscillation signal $V_{OSC}$ and the threshold signal $V_{TH}$. The time $T_{d1}$ is determined by the threshold signal $V_{TH}$ and the low threshold voltage $V_L$.

Figure 7:
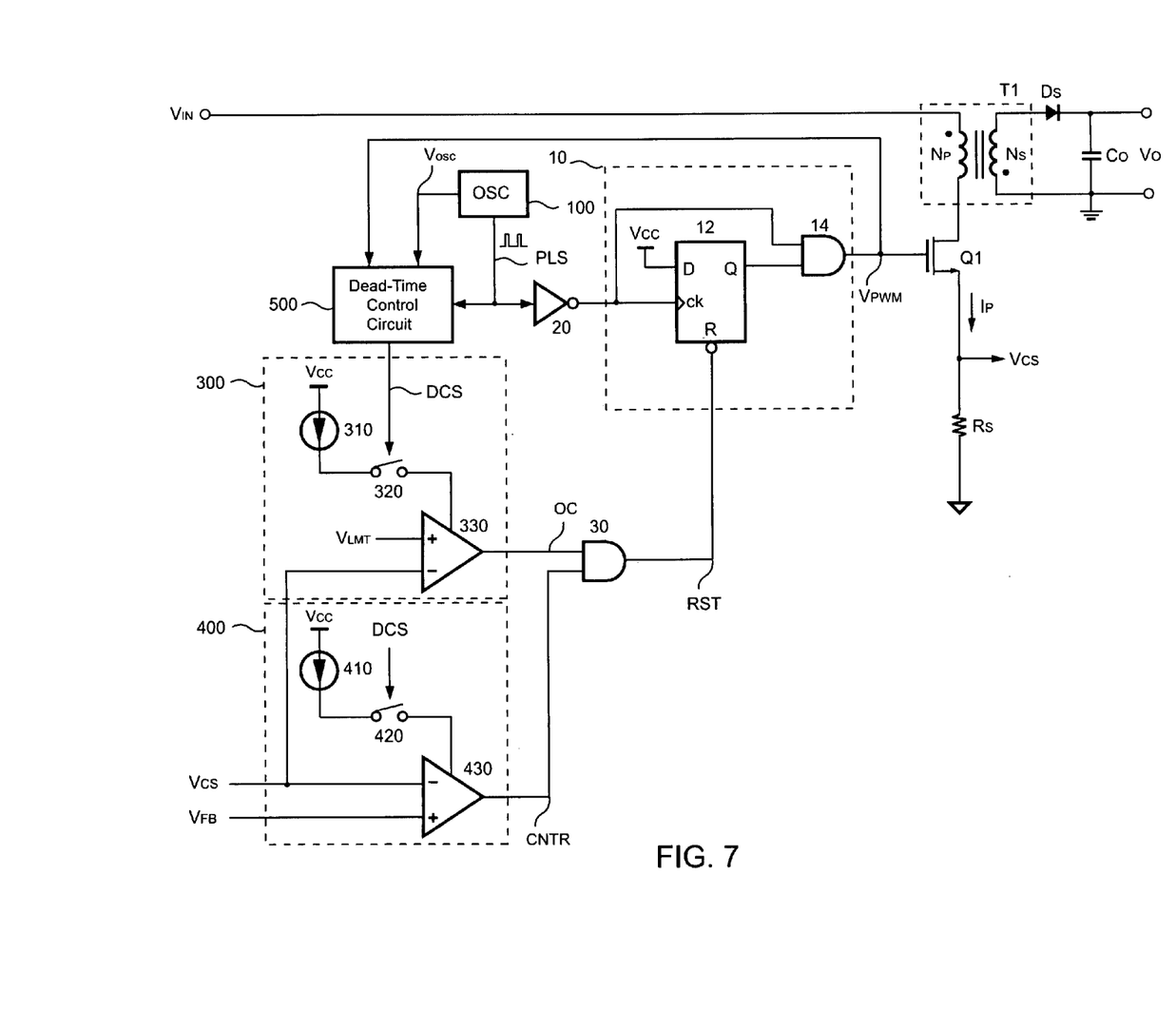
FIG. 7 shows a circuit diagram of third embodiment of the power supply with the PWM circuit and the power saving circuit in accordance with the present invention.

Referring to FIG. 7, the third embodiment of the power supply with the PWM circuit and the power saving circuit is illustrated according to the present invention. AS shown in FIG. 7, most of the circuits of this embodiment are the same as the embodiment in FIG. 3 and no more description here, the pulse signal PLS of this embodiment is further coupled to the dead-time control circuit 500 for controlling the dead-time control signal DCS.

Figure 8:
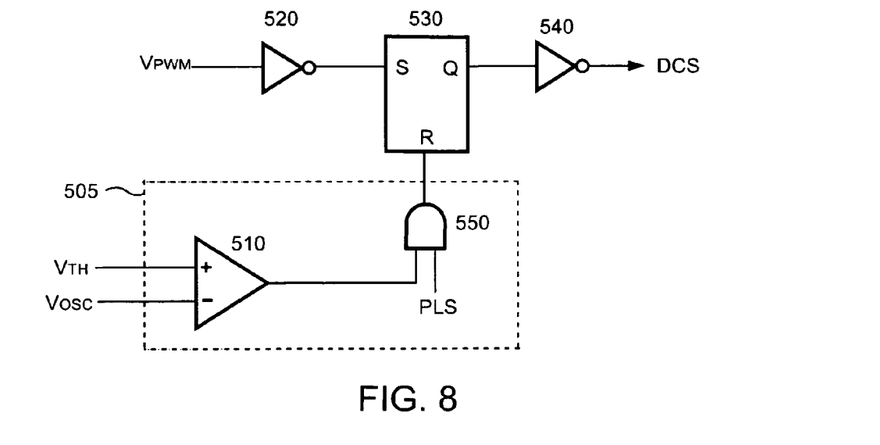
FIG. 8 shows a circuit diagram of second embodiment of the dead-time control circuit in accordance with the present invention.
Figure 9:
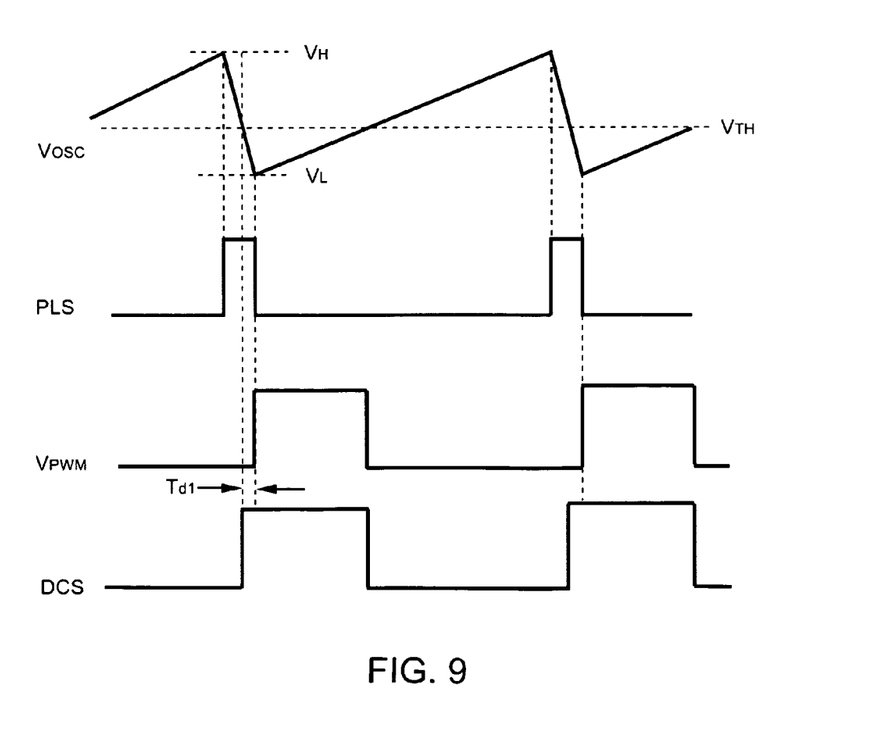
FIG. 9 shows waveforms of the power saving circuit of the present invention.

Referring to FIG. 8, the second embodiment of the dead-time control circuit is illustrated according to the present invention. AS shown in FIG. 8, most of the circuits of the dead-time control circuit 500 of this embodiment are the same as the dead-time control circuit 500 of the embodiment in FIG. 5 no more description here, the pre-enabling circuit 505 of this embodiment is further includes a AND gate 550. The input terminals of the AND gate 550 are coupled to the pulse signal PLS and the output terminal of the comparator 510 respectively. The output terminal of the AND gate 550 is coupled to the reset input terminal R of the flip-flop 530 to reset the flip-flop 530. The pre-enabling circuit 505 stops resetting the flip-flop 530 when the pulse signal PLS is disabled. The waveform of the dead-time control signal DCS is shown in FIG. 9.

Figure 10:
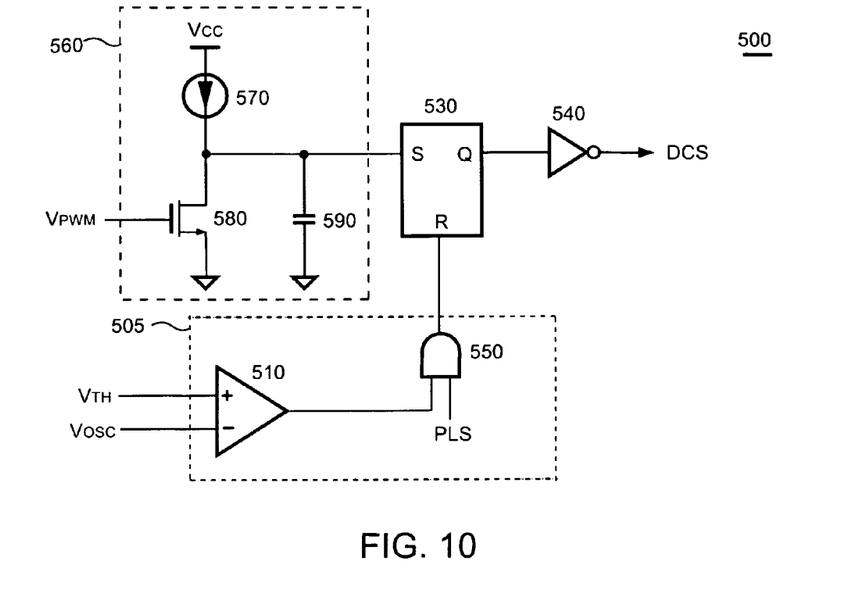
FIG. 10 shows a circuit diagram of third embodiment of the dead-time control circuit in accordance with the present invention.

Referring to FIG. 10, the third embodiment of the dead-time control circuit is illustrated according to the present invention. AS shown in FIG. 10, most of the circuits of the dead-time control circuit 500 of this embodiment are the same as the dead-time control circuit 500 of the embodiment in FIG. 8 no more description here, the dead-time control circuit 500 of this embodiment is further comprises a delay circuit 560 to replace the inverter 520 (shown in FIG. 8). The delay circuit 560 includes a current source 570, transistor 580 and a capacitor 590. The current source 570 is coupled to the supply voltage $V_{CC}$ and the capacitor 590 for charging the capacitor 590. The capacitor 590 is coupled to the set input terminal S of the flip-flop 530. The current source is further coupled to the transistor 580. The switching signal $V_{PWM}$ is coupled to the transistor 580 to drive the transistor 580. The transistor 580 is further coupled to the ground. The delay circuit 560 is utilized to delay that the switching signal $V_{PWM}$ disables the dead-time control signal DCS when the switching signal $V_{PWM}$ is disabled. Therefore, the dead-time control signal DCS is disabled after the switching signal $V_{PWM}$ is disabled.

Figure 11:
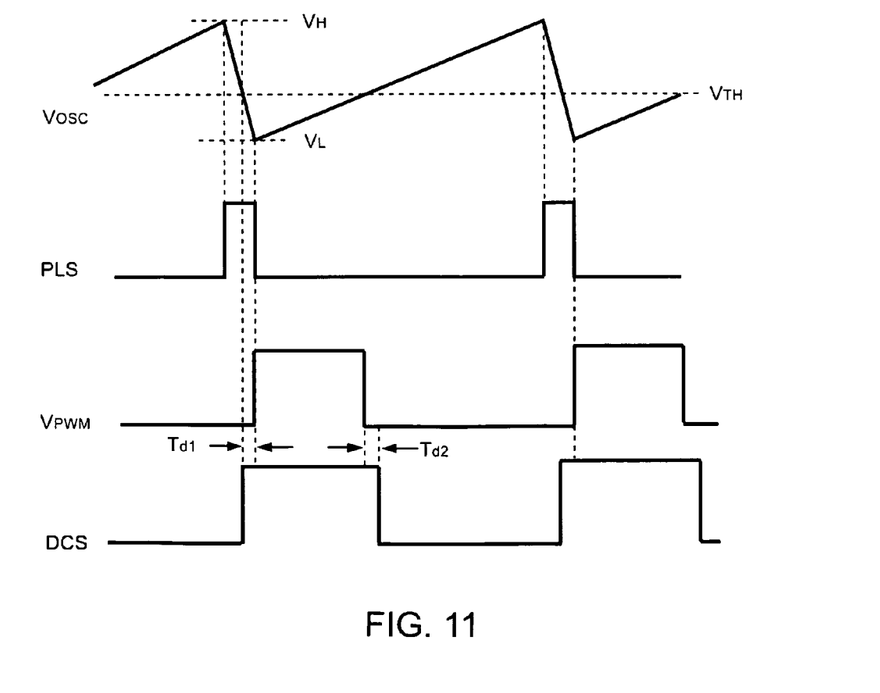
FIG. 11 shows waveforms of the power saving circuit of the present invention.

Referring to FIG. 11, it shows waveforms of the power saving circuit of the present invention. AS shown in FIG. 11, the waveform of the dead-time control signal DCS is generated by the dead-time control circuit 500 in FIG. 10. The delay circuit 560 of dead-time control circuit 500 is utilized to delay the disablement of the dead-time control signal DCS for time $T_{d2}$ when the switching signal $V_{PWM}$ is disabled. Therefore, the dead-time control signal DCS is disabled after the switching signal $V_{PWM}$ is disabled. The time $T_{d2}$ is determined by the current of the current source 570 and the capacitance of the capacitor 590 (shown in FIG. 10).

Figure 12:
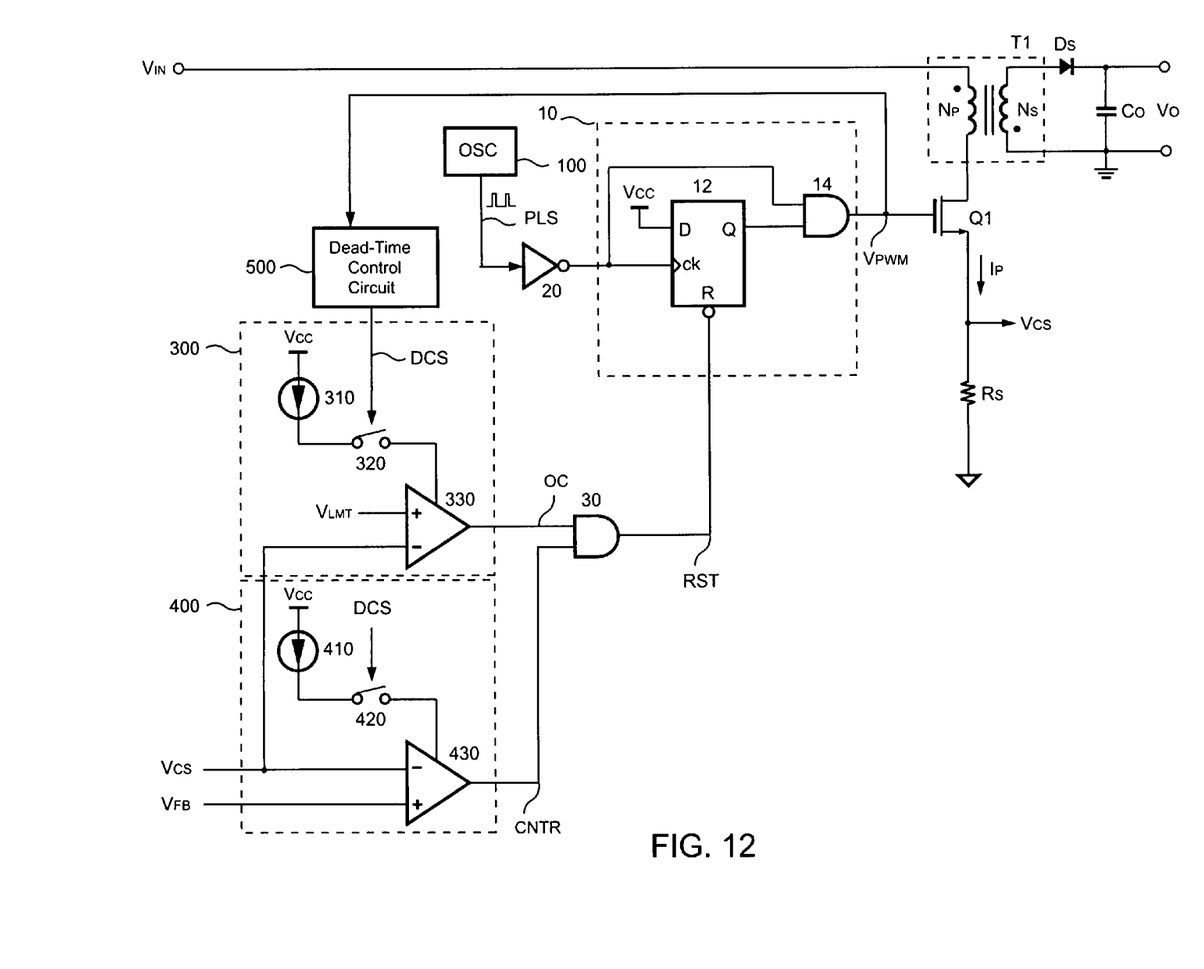
FIG. 12 shows a circuit diagram of fourth embodiment of the power supply with the PWM circuit and the power saving circuit in accordance with the present invention.
Figure 13:
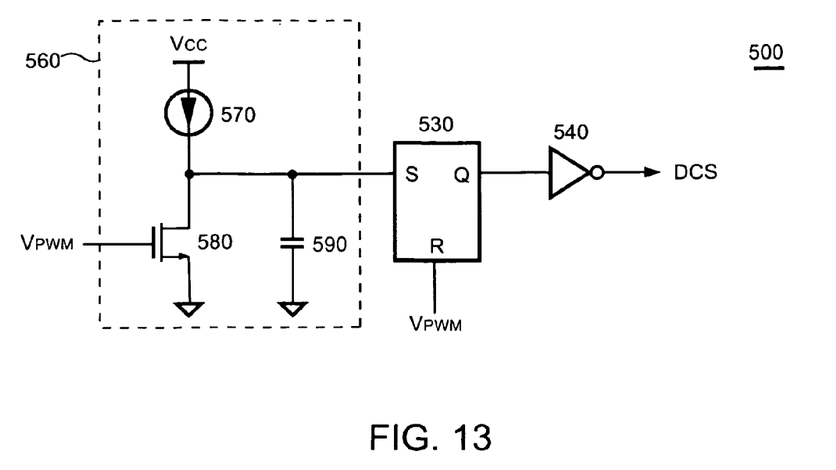
FIG. 13 shows a circuit diagram of fourth embodiment of the dead-time control circuit in accordance with the present invention.
Figure 14:
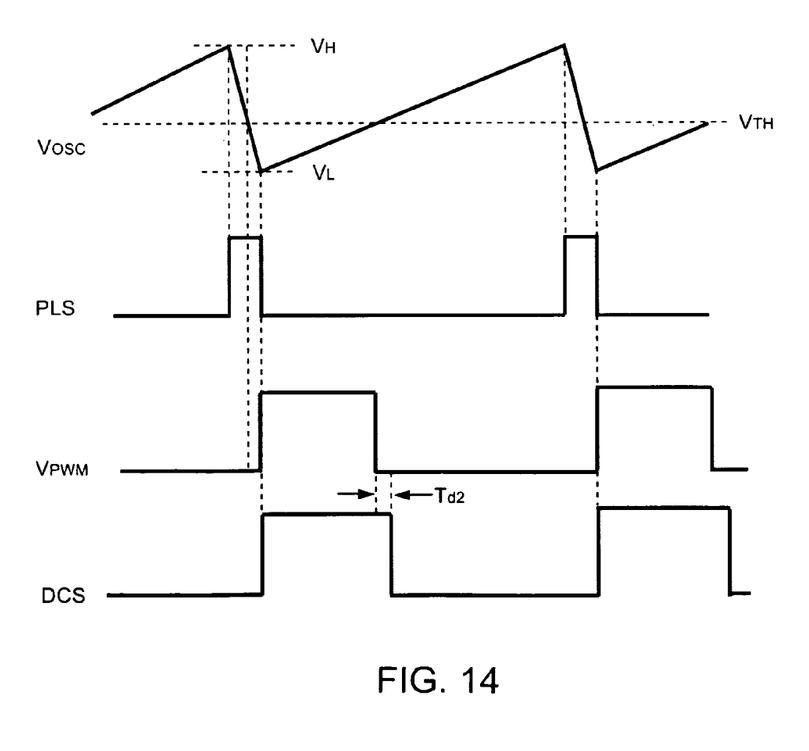
FIG. 14 shows waveforms of the power saving circuit of the present invention.

Referring to FIG. 12, the fourth embodiment of the power supply with the PWM circuit and the power saving circuit is illustrated according to the present invention. AS shown in FIG. 12, most of the circuits of this embodiment are the same as the embodiment in FIG. 7 and no more description here, the pulse signal PLS and the oscillation signal $V_{OSC}$ of this embodiment are not coupled to the dead-time control circuit 500. AS shown in the FIG. 13, the switching signal $V_{PWM}$ is coupled to the reset input terminal R of the flip-flop 530 to reset the flip-flop 530 without the pre-enabling circuit 505 of the embodiment in FIG. 10. Therefore, the dead-time control signal DCS is enabled when the switching signal $V_{PWM}$ is enabled shown in FIG. 14.

Accordingly, the prevent invention provides the power saving circuit to control the internal circuit for power saving. The power saving circuit disables the internal circuit when the PWM signal is disabled. Thus, the power saving circuit can reduce the power consumption for power saving when the switching signal is disabled.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A power saving circuit for PWM circuit, comprising:
   a switching circuit generating a switching signal; and
   a dead-time control circuit generating a dead-time control signal to control at least one internal circuit in response to the switching signal, wherein the dead-time control signal disables the internal circuit for power saving when the switching signal is disabled.

2. The power saving circuit for PWM circuit as claimed in claim 1, wherein the dead-time control signal is enabled before the switching signal is enabled.

3. The power saving circuit for PWM circuit as claimed in claim 2, wherein the dead-time control circuit comprises a pre-enabling circuit for pre-enabling the dead-time control signal before the switching signal is enabled.

4. The power saving circuit for PWM circuit as claimed in claim 1, wherein the dead-time control signal is disabled after the switching signal is disabled.

5. The power saving circuit for PWM circuit as claimed in claim 4, wherein the dead-time control circuit comprises a delay circuit for delaying the disablement of the dead-time control signal when the switching signal is disabled.

6. The power saving circuit for PWM circuit as claimed in claim 1, further comprising an oscillator generating a pulse signal for the switching circuit generating the switching signal in response to the pulse signal.

7. The power saving circuit for PWM circuit as claimed in claim 1, further comprising an oscillator generating an oscillation signal for the dead-time control circuit controlling the dead-time control signal in response to the oscillation signal.

8. The power saving circuit for PWM circuit as claimed in claim 7, wherein the dead-time control circuit enables the dead-time control signal when the oscillation signal is lower than a threshold signal.

9. The power saving circuit for PWM circuit as claimed in claim 7, wherein the oscillator further generates a pulse signal for the dead-time control circuit controlling the dead-time control signal in response to the oscillation signal and the pulse signal.

10. The power saving circuit for PWM circuit as claimed in claim 1, wherein the switching signal is utilized to switch a transformer.

11. The power saving circuit for PWM circuit as claimed in claim 1, wherein the internal circuit can be a protection circuit of the PWM circuit.

12. The power saving circuit for PWM circuit as claimed in claim 11, wherein the protection circuit generates a reset signal to reset the switching circuit for disabling the switching signal.

13. The power saving circuit for PWM circuit as claimed in claim 1, wherein the internal circuit is included in the PWM circuit internally.

14. A power saving circuit for PWM circuit, comprising:
a switching circuit generating a switching signal to switch a circuit;
wherein the switching signal is further utilized to control at least one internal circuit, the switching signal disables the internal circuit for power saving when the switching signal is disabled.

15. The power saving circuit for PWM circuit as claimed in claim 14, further comprising an oscillator generating a pulse signal for the switching circuit generating the switching signal in response to the pulse signal.

16. The power saving circuit for PWM circuit as claimed in claim 14, wherein the switching signal is utilized to switch a transformer.

17. The power saving circuit for PWM circuit as claimed in claim 14, wherein the internal circuit can be a protection circuit of the PWM circuit.

18. The power saving circuit for PWM circuit as claimed in claim 17, wherein the protection circuit generates a reset signal to reset the switching circuit for disabling the switching signal.

19. The power saving circuit for PWM circuit as claimed in claim 14, wherein the internal circuit is included in the PWM circuit internally.

* * * * *